(12) United States Patent
Shah

(10) Patent No.: US 6,782,336 B2
(45) Date of Patent: Aug. 24, 2004

(54) TEST OUTPUTS USING AN IDLE BUS

(75) Inventor: Paras A. Shah, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 80 days.

(21) Appl. No.: 09/953,836

(22) Filed: Sep. 17, 2001

(65) Prior Publication Data

US 2003/0060995 A1 Mar. 27, 2003

(51) Int. Cl.$^7$ .............................................. G06F 19/00
(52) U.S. Cl. ................ 702/118; 702/117; 327/63; 327/18; 370/359; 370/419; 714/733; 714/734; 714/735; 324/73.1; 324/656
(58) Field of Search ................... 702/117, 118, 702/120, 124, FOR 103, 104, 106, 134, 170, 171; 327/63, 18, 27; 370/359, 419, 421, 463; 714/733, 734, 724, 735, 736, 738, 742, 743; 324/73.1, 656, 647, 754; 703/14, 28

(56) References Cited

U.S. PATENT DOCUMENTS

| | | | | |
|---|---|---|---|---|
| 5,331,571 A | * | 7/1994 | Aronoff et al. | 364/490 |
| 6,191,603 B1 | * | 2/2001 | Muradali et al. | 324/765 |
| 2001/0052786 A1 | * | 12/2001 | Eldridge et al. | 324/765 |
| 2002/0035442 A1 | * | 3/2002 | Dervisoglu et al. | 702/120 |

OTHER PUBLICATIONS

Page et al., A FPGA ASIC Communication Channel Systems Emulator, 1993, IEEE, vol: 1575, pp. 345–348.*

* cited by examiner

Primary Examiner—Marc S. Hoff
Assistant Examiner—Elias Desta (57) ABSTRACT

A test circuit receives a plurality of internal test signals and delivers a group of the plurality of internal test signals onto a bus during an idle state of the bus. The bus is coupled to output pins so that the group of internal test signals can be used in debugging operations. The test circuit may include a multiplexing circuit that receives the plurality of internal test signals as inputs and that delivers a selected group of the internal test signals as outputs. The test circuit may also include a switch that couples the selected group of the internal test signals onto the bus during an idle state.

43 Claims, 7 Drawing Sheets

TEST OUTPUTS USING AN IDLE BUS

FIELD OF THE INVENTION

The present invention relates generally to a method for enhancing the testing of an electronic circuit, such as a circuit for use in a computer system. More particularly, the present technique improves the testing of an integrated circuit, such as an application specific integrated circuit (ASIC), by utilizing a more efficient method of managing an idle bus.

BACKGROUND OF THE RELATED ART

This section is intended to introduce the reader to various aspects of art, which may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In the past twenty years, great strides have been made in electronic circuitry. The electronic devices, such as transistors, that comprise integrated circuits have become much smaller, thus making the integrated circuits much denser. This increased density has lead to greatly enhanced functionality of integrated circuits. However, such enhanced functionality has come at the expense of complexity. Indeed, as compared to an integrated circuit made twenty years ago, today's integrated circuits, as well as the electronic circuits in which such integrated circuits are used, are vastly more complex.

For example, today a conventional computer system typically includes one or more central processing units (CPUs) and one or more memory subsystems. A CPU typically includes at least one processor, such as a microprocessor, and supporting circuits, such as a host controller, bridges, and a memory controller. Computer systems also typically include peripheral devices for inputting and outputting data. Some common peripheral devices include, for example, monitors, keyboards, printers, modems, hard disk drives, floppy disk drives, and network controllers. The various components of computer system communicate and transfer data using various buses and other communication channels that interconnect the respective components. Such communication often takes place at frequencies of a few hundred megahertz to a few gigahertz—frequencies that were thought unreachable just a few years ago.

During the design phase of an electronic system, such as a computer system, each portion of the system is typically tested to ensure that the system will operate properly when produced. This type of testing is usually referred to as "debugging." Many integrated circuits, such as microprocessors and application specific integrated circuits (ASICs), are initially designed using software design tools. While in software, the person debugging the system may use any internal test point to understand the functions and issues that are presented. This is not the case once the circuit is actually reduced to hardware.

Once the integrated circuit is in hardware form, it includes a number of pins used for input, output, power, ground, etc. Generally, the input and output pins of an integrated circuit may be sampled externally when the circuit is in hardware. In testing the circuit, however, the input and output pins do not always help the person debugging the circuit, because many hardware issues within the circuit may not generate a signal on the input or output pins. Thus, to facilitate the testing of an integrated circuit, most integrated circuits include test pins in addition to the normal pins used for input, output, power, ground, etc. These test pins provide the debugger with access to some of the internal data points that may be useful in resolving a hardware problem.

A limitation associated with the test pins is that the number of internal test points that are desirable is much larger than the output pins that are available. Each pin on an integrated circuit increases its size, cost, and complexity. Thus, the number of test pins is often a compromise between adding to the size, cost, and complexity of the integrated circuit and providing debuggers with a useful number of signals. Generally speaking, it is desirable to have fewer test pins and more operational or functional pins because, while the test pins are needed in testing, once testing is completed the test pins are not used by the system to perform the task for which the integrated circuit was designed.

In an attempt to address this problem, a multiplexor circuit may be added to the integrated circuit to select a subset of the internal test points based on a software-configurable value. For example, if the integrated circuit includes 18 test pins and if the multiplexor circuit permits one of 32 groups of 18 internal test points to be sent to the test pins at any given time, the debuggers can choose up to 576 internal test points. Although such a technique allows the debugger to sample a relatively large number of internal signals using a relatively small number of test pins, the technique is not without its drawbacks. For example, a problem faced by a debugger involves the need to view simultaneously two or more signals in different sets of the 32 groups of 18 signals.

This problem can be somewhat alleviated by breaking up each of the groups of signals into sets using multiple selects. For instance, following the ongoing example, each group of 18 signals could be broken up into three sets of six signals each. While this provides debuggers with some additional flexibility, the absolute number of test signals available at any given time remains fixed. Also, designers can attempt to position signals carefully so that subsequent debuggers will have the best chance to see all of the necessary signals simultaneously. While this technique has also produced some desirable results, designers cannot accurately predict which signals will be needed in determining the root cause of a hardware problem.

As a result of these drawbacks, debuggers can often expend a significant amount of time troubleshooting a circuit to resolve failures. Therefore, it would be advantageous to have additional test data available to the user without using additional dedicated test pins and/or to reduce or eliminate the number of dedicated test pins while still providing access to internal test points for use in debugging the device.

The present invention may address one or more of the problems discussed above.

BRIEF DESCRIPTION OF THE DRAWINGS

The foregoing and other advantages of the invention may become apparent upon reading the following detailed description and upon reference to the drawing in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
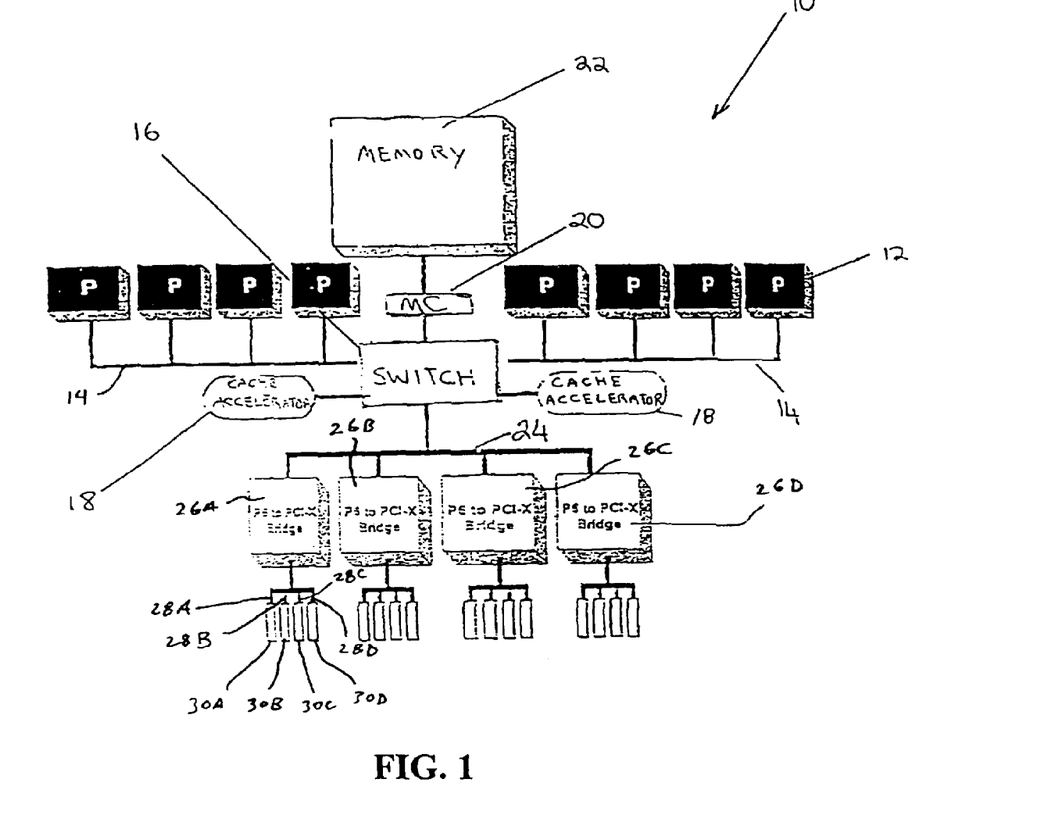
FIG. 1 illustrates a diagram of an exemplary computer system in accordance with the present invention.

Turning now to the drawings, and referring initially to FIG. 1, a multiprocessor computer system, for example a Proliant 8500 PCI-X from Compaq Computer Corporation, is illustrated and designated by the reference numeral 10. In this embodiment of the system 10, multiple processors 12 control many of the functions of the system 10. The processors 12 may be, for example, Pentium, Pentium Pro, Pentium II Xeon (Slot-2), or Pentium III processors available from Intel Corporation. However, it should be understood that the number and type of processors are not critical to the technique described herein and are merely being provided by way of example. As can be appreciated, however, processors, such as the microprocessors available today, are quite complex circuits that typically include an arithmetic logic unit, internal busses, internal memory, decoders, I/O busses, etc.

Typically, the processors 12 are coupled to one or more processor busses, such as the respective processor busses 14. The processor busses 14 transmit the transactions and data between the individual processors 12 and a host controller or switch 16. The switch 16 signals between the processor busses 14, cache accelerator 18, and a memory controller 20. A crossbar switch is shown in this embodiment, however, it should be noted that any suitable type of controller or switch may be used in the operation of the system 10. When the data is retrieved from the memory 22, the transactions are sent via the memory controller 20. The memory controller 20 may be of any type suitable for such a system, such as, a Profusion memory controller. It should be understood that the number and type of memory, switches, memory controllers, and cache accelerators are not critical to the technique described herein, and are merely being provided by way of example.

The switch 16 directs data between the processor busses 14 and either the cache accelerator 18 or the memory 22 though the use of the memory controller 20. In addition, data may be sent through an input/output (I/O) bus 24 to one or more bridges, such as the multiple PCI-X bridges 26A–D. In this example, each PCI-X bridge 26A–D is typically coupled to multiple PCI-X buses 28A–D, and each PCI-X bus 28A–D terminates at a series of slots or I/O interfaces 30A–D to which peripheral devices (not shown) may be attached.

Bridges, such as the PCI-X bridges 26A–D, typically take the form of an application specific integrated circuit (ASIC) and contain logic that processes input/output transactions. For example, a bridge typically includes address and data buffers, as well as arbitration and bus master control logic for the buses 28A–D. A bridge may also include miscellaneous logic, such as counters and timers as conventionally present in personal computer systems for example, an interrupt controller for both the PCI and I/O buses, and power management logic. Furthermore, in this example, the bridges 26A–D include one or more point-to-point unidirectional busses, i.e., the busses 28A–D.

Figure 2:
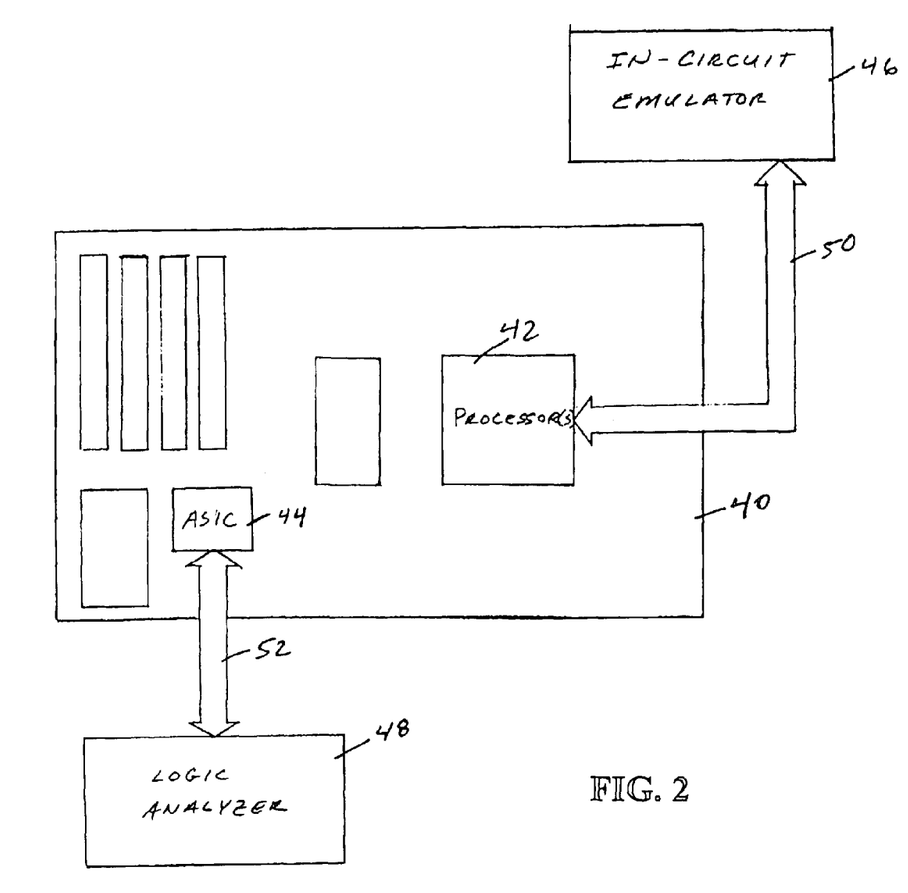
FIG. 2 illustrates a test setup including integrated circuits on a circuit board in accordance with the present invention.

A circuit, such as the system 10 illustrated in FIG. 1, may be placed on a circuit board. FIG. 2 illustrates a diagram of an exemplary circuit board 40 having various integrated circuits thereon, such as a processor 42 and an ASIC bridge 44. The circuit board 40, for example, may be a motherboard corresponding to the computer system 10. The circuit board 40 includes physical interconnections, typically referred to as traces, for the various integrated circuits on the board that enable the integrated circuits to communicate with each other. Test equipment, such as an in-circuit emulator 46 and a logic analyzer 48, may be coupled to various portions of the board 40 to perform tests that enable the designers to debug the system. In this example, the in-circuit emulator 46 actually replaces the processor 42 with a target processor which is coupled to the emulator 46 via a bus or ribbon cable 50, and the logic analyzer 48 is coupled to various pins of the ASIC bridge 44 via a bus or ribbon cable 52.

Figure 3A:
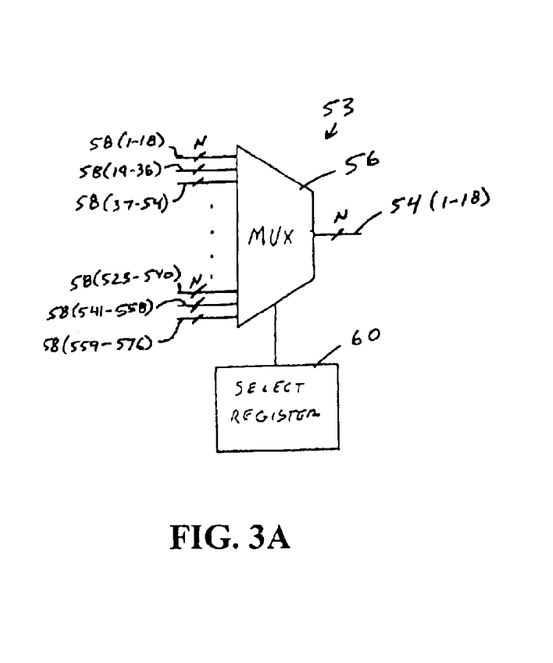
FIG. 3A illustrates a schematic diagram of a test multiplexor having a single select and being coupled to a plurality of test pins.

In view of the above description of exemplary integrated circuits in an exemplary computer circuit, it should be clear that both the integrated circuits and the computer circuit are of sufficient complexity that debugging such designs may often constitute an arduous task. To facilitate such testing, one or more of the integrated circuits, such as the processor 42 and/or the bridge 44, may include a test circuit 53, as illustrated in FIG. 3A. The test circuit includes test pins 54 that are coupled to the output of a multiplexor circuit 56, and a plurality of internal test points 58 that are coupled to the input of the multiplexors circuit 56. There are N test pins 54, where N is an integer.

In this example, N equals 18, but it should be understood that the actual number of test pins 54 may vary substantially and depend on a number of factors discussed previously, such as the number of internal test points, the complexity of the circuit, the size of the circuit, etc. The multiplexor circuit 56 is typically chosen to have a multiplexing ratio R:1 sufficient to handle the number of desired internal test points 58. In this example, the number of desired internal test points 58 equals 576. Therefore, in this example, the multiplexor circuit 56 has a multiplexing ratio of 32:1. Specifically, it should be understood that the internal test points 58 are organized into R groups of N signals—32 groups of 18 signals in this case. Thus, as illustrated in FIG. 3A, the first three groups of internal test points are designated as 58 (1–18), 58 (19–36), and 58 (37–54), and the last three groups of internal test points are designated as 58 (523–540), 58 (541–558), and 58 (559–576), with the remaining 26 groups being similarly designated in between. It should be noted that the multiplexing ratio R may vary substantially and depend on a number of factors discussed previously, such as the number of internal test points, the complexity of the circuit, the size of the circuit, etc.

The multiplexor circuit 56 is coupled to a select register 60. The select register 60 can be loaded with information, such as a binary number, which selects one of the R groups of internal test points 58 to be sent to the test pins 54 at the output of the multiplexor circuit 56. In keeping with the running example, to select among 32 groups using binary numbers, the select register 60 may be five bits wide. Therefore, to select the first group of internal test points 58 (1–18), the debugger would load the select register 60 with the binary number 00000, and to select the last group of internal test points 58 (559–576), the debugger would load the select register 60 with the binary number 11111. Thus, any of the 32 groups of 18 internal test points 58 may be displayed to the debugger.

Figure 3B:
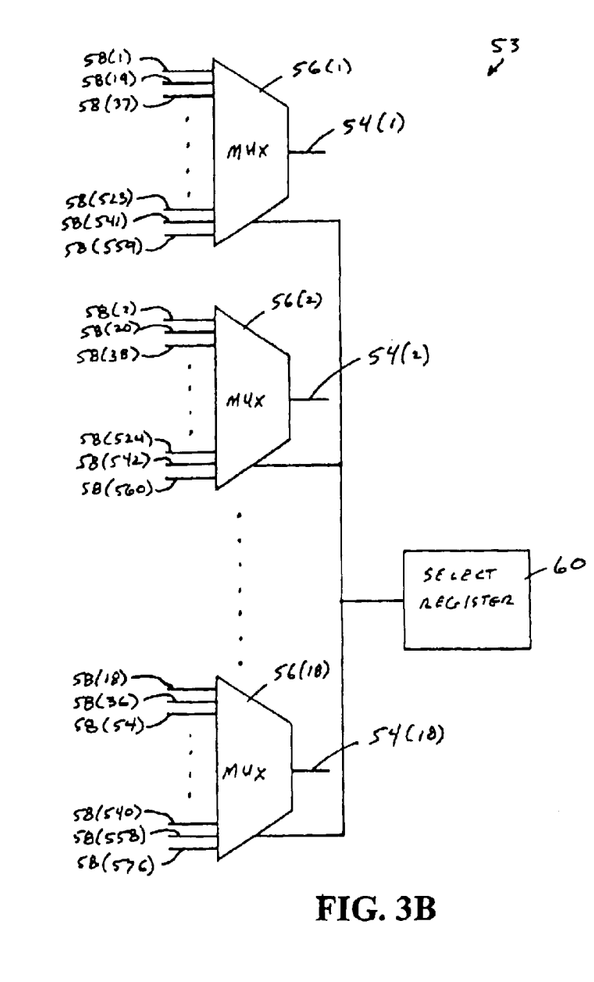
FIG. 3B illustrates a more detailed schematic diagram of FIG. 3A.

A more detailed diagram of the test circuit 53 is illustrated in FIG. 3B. As illustrated in FIG. 3B, the multiplexor circuit 56 may include N multiplexors 56 (1)–56 (N), wherein each multiplexor 56 (1)–56 (N) has R inputs for the internal test points 58. In the running example, the test circuit 53 includes eighteen multiplexors 56 (1)–56 (18), where each multiplexor 56 (1)–56 (18) has 32 inputs for the internal test points 58. The first multiplexor 56 (1) accepts the first test point 58 (1), 58 (19), 58 (37) . . . 58 (523), 58 (541), and 58 (559) from each of the 32 groups, the second multiplexor 56 (2) accepts the second test point 58 (2), 58 (20), 58 (38) . . . 58 (524), 58 (542), and 58 (560) from each of the 32 groups, and so on, and the last multiplexor 56 (18) accepts the final test point 58 (18, 58 (36), 58 (54) . . . 58 (540), 58 (558), and 58 (576) from each of the 32 groups. Given this arrangement, when the select register 60 chooses the first bit on each multiplexor 56 (1)–56 (18), the first group of internal test points 58 (1–18) is selected and delivered to the test pins 54 (1–18). The remaining groups are similarly chosen, e.g., when the select register 60 chooses the last bit on each multiplexor 56 (1)–56 (18), the last group of internal test points 58 (559–576) is selected and delivered to the test pins 54 (1–18).

The test pins 54 may display the data that is collected from the internal test points 58 as set forth in Table 1 below. As discussed above, which group of the internal test points 58 that is displayed depends on the selection made by the select register 60. Thus, the Table 1 is divided into 18 columns for the 18 test pins 54 and 32 rows for the 32 groups of internal test points 58. The row numbering starts with first group of internal data points 58 (1–18) in Row 1 and ends with the last group of internal data points 58 (559–576) in Row 32. The select register 60 determines which row is selected to be displayed on the test pins 54. The select register 60 may be adjusted by the software to allow different rows to be selected within the Table 1, such as Row 9 for example. However, it should be noted that only one row may be selected at any given time. Therefore, if one or more signals in one row would be useful or necessary to debug a particular problem, but one or more signals in another row or rows would also be useful or necessary to debug the problem, the debugger will be at a disadvantage because all of the useful signals cannot be presented at the same time.

TABLE 1

|    | 1   | 2   | 3   | 4   | 5   | 6   | 7   | 8   | 9   | 10  | 11  | 12  | 13  | 14  | 15  | 16  | 17  | 18  |
|----|-----|-----|-----|-----|-----|-----|-----|-----|-----|-----|-----|-----|-----|-----|-----|-----|-----|-----|
| 1  | 1   | 2   | 3   | 4   | 5   | 6   | 7   | 8   | 9   | 10  | 11  | 12  | 13  | 14  | 15  | 16  | 17  | 18  |
| 2  | 19  | 20  | 21  | 22  | 23  | 24  | 25  | 26  | 27  | 28  | 29  | 30  | 31  | 32  | 33  | 34  | 35  | 36  |
| 3  | 37  | 38  | 39  | 40  | 41  | 42  | 43  | 44  | 45  | 46  | 47  | 48  | 49  | 50  | 51  | 52  | 53  | 54  |
| 4  | 55  | 56  | 57  | 58  | 59  | 60  | 61  | 62  | 63  | 64  | 65  | 66  | 67  | 68  | 69  | 70  | 71  | 72  |
| 5  | 73  | 74  | 75  | 76  | 77  | 78  | 79  | 80  | 81  | 82  | 83  | 84  | 85  | 86  | 87  | 88  | 89  | 90  |
| 6  | 91  | 92  | 93  | 94  | 95  | 96  | 97  | 98  | 99  | 100 | 101 | 102 | 103 | 104 | 105 | 106 | 107 | 108 |
| 7  | 109 | 110 | 111 | 112 | 113 | 114 | 115 | 116 | 117 | 118 | 119 | 120 | 121 | 122 | 123 | 124 | 125 | 126 |
| 8  | 127 | 128 | 129 | 130 | 131 | 132 | 133 | 134 | 135 | 136 | 137 | 138 | 139 | 140 | 141 | 142 | 143 | 144 |
| 9  | 145 | 146 | 147 | 148 | 149 | 150 | 151 | 152 | 153 | 154 | 155 | 156 | 157 | 158 | 159 | 160 | 161 | 162 |
| 10 | 163 | 164 | 165 | 166 | 167 | 168 | 169 | 170 | 171 | 172 | 173 | 174 | 175 | 176 | 177 | 178 | 179 | 180 |
| 11 | 181 | 182 | 183 | 184 | 185 | 186 | 187 | 188 | 189 | 190 | 191 | 192 | 193 | 194 | 195 | 196 | 197 | 198 |
| 12 | 199 | 200 | 201 | 202 | 203 | 204 | 205 | 206 | 207 | 208 | 209 | 210 | 211 | 212 | 213 | 214 | 215 | 216 |
| 13 | 217 | 218 | 219 | 220 | 221 | 222 | 223 | 224 | 225 | 226 | 227 | 228 | 229 | 230 | 231 | 232 | 233 | 234 |
| 14 | 235 | 236 | 237 | 238 | 239 | 240 | 241 | 242 | 243 | 244 | 245 | 246 | 247 | 248 | 249 | 250 | 251 | 252 |
| 15 | 253 | 254 | 255 | 256 | 257 | 258 | 259 | 260 | 261 | 262 | 263 | 264 | 265 | 266 | 267 | 268 | 269 | 270 |
| 16 | 271 | 272 | 273 | 274 | 275 | 276 | 277 | 278 | 279 | 280 | 281 | 282 | 283 | 284 | 285 | 286 | 287 | 288 |

TABLE 1-continued

| 17 | 289 | 290 | 291 | 292 | 293 | 294 | 295 | 296 | 297 | 298 | 299 | 300 | 301 | 302 | 303 | 304 | 305 | 306 |
|---|---|---|---|---|---|---|---|---|---|---|---|---|---|---|---|---|---|---|
| 18 | 307 | 308 | 309 | 310 | 311 | 312 | 313 | 314 | 315 | 316 | 317 | 318 | 319 | 320 | 321 | 322 | 323 | 324 |
| 19 | 325 | 326 | 327 | 328 | 329 | 330 | 331 | 332 | 333 | 334 | 335 | 336 | 337 | 338 | 339 | 340 | 341 | 342 |
| 20 | 343 | 344 | 345 | 346 | 347 | 348 | 349 | 350 | 351 | 352 | 353 | 354 | 355 | 356 | 357 | 358 | 359 | 360 |
| 21 | 361 | 362 | 363 | 364 | 365 | 366 | 367 | 368 | 369 | 370 | 371 | 372 | 373 | 374 | 375 | 376 | 377 | 378 |
| 22 | 379 | 380 | 381 | 382 | 383 | 384 | 385 | 386 | 387 | 388 | 389 | 390 | 391 | 392 | 393 | 394 | 395 | 396 |
| 23 | 397 | 398 | 399 | 400 | 401 | 402 | 403 | 404 | 405 | 406 | 407 | 408 | 409 | 410 | 411 | 412 | 413 | 414 |
| 24 | 415 | 416 | 417 | 418 | 419 | 420 | 421 | 422 | 423 | 424 | 425 | 426 | 427 | 428 | 429 | 430 | 431 | 432 |
| 25 | 433 | 434 | 435 | 436 | 437 | 438 | 439 | 440 | 441 | 442 | 443 | 444 | 445 | 446 | 447 | 448 | 449 | 450 |
| 26 | 451 | 452 | 453 | 454 | 455 | 456 | 457 | 458 | 459 | 460 | 461 | 462 | 463 | 464 | 465 | 466 | 467 | 468 |
| 27 | 469 | 470 | 471 | 472 | 473 | 474 | 475 | 476 | 477 | 478 | 479 | 480 | 481 | 482 | 483 | 484 | 485 | 486 |
| 28 | 487 | 488 | 489 | 490 | 491 | 492 | 493 | 494 | 495 | 496 | 497 | 498 | 499 | 500 | 501 | 502 | 503 | 504 |
| 29 | 505 | 506 | 507 | 508 | 509 | 510 | 511 | 512 | 513 | 514 | 515 | 516 | 517 | 518 | 519 | 520 | 521 | 522 |
| 30 | 523 | 524 | 525 | 526 | 527 | 528 | 529 | 530 | 531 | 532 | 533 | 534 | 535 | 536 | 537 | 538 | 539 | 540 |
| 31 | 541 | 542 | 543 | 544 | 545 | 546 | 547 | 548 | 549 | 550 | 551 | 552 | 553 | 554 | 555 | 556 | 557 | 558 |
| 32 | 559 | 560 | 561 | 562 | 563 | 564 | 565 | 566 | 567 | 568 | 569 | 570 | 571 | 572 | 573 | 574 | 575 | 576 |

Figure 4A:
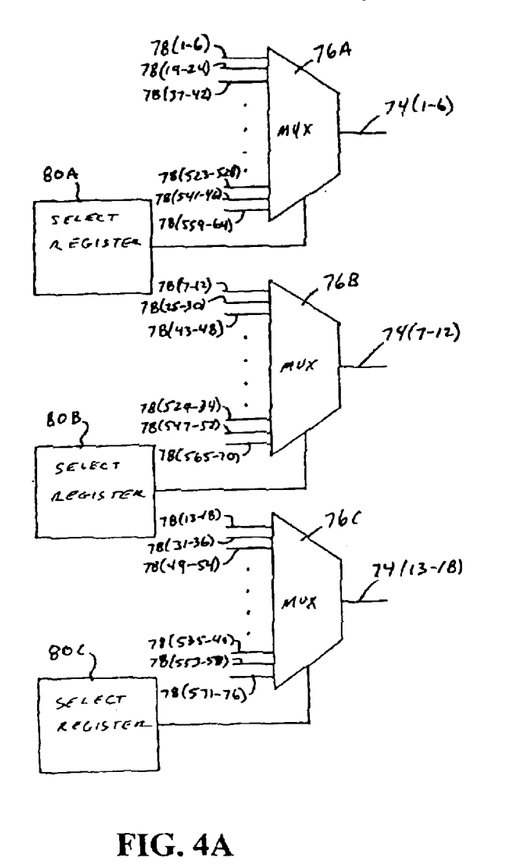
FIG. 4A illustrates a schematic diagram of test mulitplexors having multiple selects and being coupled to a plurality of test pins.

To increase the flexibility of the selection of the internal test points 58, an alternate test circuit 70 may be used, as illustrated in FIG. 4A. The test circuit 70 operates quite similarly to the test circuit 53, except that it uses multiple selects rather than a single select. The test circuit includes test pins 74 that are coupled to the output of multiple multiplexor circuits 76, and a plurality of internal test points 78 that are coupled to the input of the multiple multiplexors circuits 76. There are N test pins 74, where N is an integer. In this example, N equals 18, but it should be understood that the actual number of test pins 74 may vary substantially and depend on a number of factors discussed previously, such as the number of internal test points, the complexity of the circuit, the size of the circuit, etc. Furthermore, in this example, three multiplexor circuits 76A, 76B, and 76C are used, so that the 18 test pins 74 may be divided into three sets 74 (1–6), 74 (7–12), and 74 (13–18) capable of outputting six internal test points apiece. It should be noted that the number of multiplexing circuits may vary substantially and depend on a number of factors, such as the complexity of the circuit, the number of desired sets, the provision for extra complexity in the multiplexing logic, etc.

Each multiplexor circuit 76A, 76B, and 76C is typically chosen to have a multiplexing ratio R:1 sufficient to handle the number of desired internal test points 78. In this example, the number of desired internal test points 78 equals 576. Therefore, in this example, each of the three multiplexor circuits 76A, 76B, and 76C has a multiplexing ratio of 32:1. It should be noted that the multiplexing ratio R may vary substantially and depend on a number of factors discussed previously, such as the number of internal test points, the complexity of the circuit, the size of the circuit, etc. As in the previously described test circuit 53, the internal data points 78 are organized into R groups of N signals—32 groups of 18 signals in this case. Also, because of the multiple multiplexor circuits 76A, 76B, and 76C, the 18 signals are divided into three sets of six. Thus, as illustrated in FIG. 4A, the first three groups of internal test points on the first multiplexor circuit 76A are designated as 78 (1–6), 78 (19–24), and 78 (37–42), and the last three groups of internal test points are designated as 78 (523–528), 78 (541–546), and 78 (559–564), with the remaining 26 groups being similarly designated in between; the first three groups of internal test points on the second multiplexor circuit 76B are designated as 78 (7–12), 78 (25–30), and 78 (43–48), and the last three groups of internal test points are designated as 78 (529–534), 78 (547–552), and 78 (565–570), with the remaining 26 groups being similarly designated in between; and the first three groups of internal test points on the third multiplexor circuit 76C are designated as 78 (13–18), 78 (31–36), and 78 (49–54), and the last three groups of internal test points are designated as 78 (535–540), 78 (553–558), and 78 (571–576), with the remaining 26 groups being similarly designated in between.

Each of the multiplexor circuits 76A, 76B, and 76C is coupled to a respective select register 80A, 80B, and 80C. The select registers 80A, 80B, and 80C can be loaded with information, such as a binary number, which selects one of the R groups of internal data points 78 to be sent to the test pins 74 at the output of the multiplexor circuits 76A, 76B, and 76C. In keeping with the running example, to select among 32 groups using binary numbers, each select register 80A, 80B, and 80C may be five bits wide. Therefore, to select the first group of internal test points 78 (1–6) on the first multiplexor circuit 76A, the debugger would load the select register 80A with the binary number 00000, and to select the last group of internal test points 78 (559–564), the debugger would load the select register 80A with the binary number 11111. Similarly, to select the first group of internal test points 78 (7–12) on the second multiplexor circuit 76B, the debugger would load the select register 80B with the binary number 00000, and to select the last group of internal test points 78 (565–570), the debugger would load the select register 80B with the binary number 11111. Finally, to select the first group of internal test points 78 (13–18) on the third multiplexor circuit 76C, the debugger would load the select register 80C with the binary number 00000, and to select the last group of internal data points 78 (571–576), the debugger would load the select register 80C with the binary number 11111. Thus, as in the previous example, any of the 32 groups of 18 internal data points 78 may be displayed to the debugger. However, flexibility is further facilitated (as described below with respect to Table 2) because the 18 internal test points 78 selected need not all be in the same row. Rather, different sets may be in different rows.

Figure 4B:
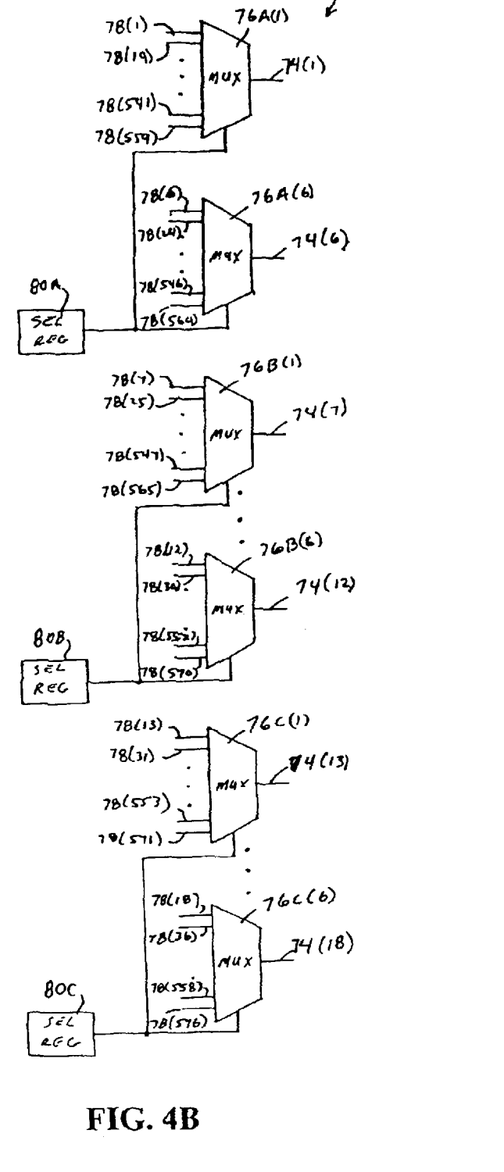
FIG. 4B illustrates a more detailed schematic diagram of FIG. 4A.

A more detailed diagram of the test circuit 70 is illustrated in FIG. 4B. As illustrated in FIG. 4B, the multiplexor circuit 76 may include N multiplexors, wherein each multiplexor has R inputs for the internal data points 78. In the running example, the test circuit 70 includes eighteen multiplexors 76A (1–6), 76B (1–6), and 76C (1–6), where each multiplexor has 32 inputs for the internal test points 78. In the first group of multiplexors 76A, the first multiplexor 76A (1) accepts the first test point 78 (1), 78 (19) . . . 78 (541), and 78 (559) from each of the 32 groups, the second multiplexor 76A (2) accepts the second test point 78 (2), 78 (20) . . . 78 (542), and 78 (560) from each of the 32 groups, and so on, and the last multiplexor 76A (6) accepts the sixth test point 78 (6), 78 (24) . . . 78 (546), and 78 (564) from each of the 32 groups. Given this arrangement, when the select register 80A chooses the first bit on each multiplexor 76A (1)–76A (6), the first group of the first set of six internal test points 78 (1–6) is selected and delivered to the test pins 74 (1–6). The remaining groups are similarly chosen, e.g., when the select register 80A chooses the last bit on each multiplexor 76A (1)–76A (6), the last group of the first set of six internal test points 78 (559–564) is selected and delivered to the test pins 74 (1–6).

Similarly, in the second group of multiplexors 76B, the first multiplexor 76B (1) accepts the seventh test point 78 (7), 78 (25) . . . 78 (547), and 78 (565) from each of the 32 groups, the second multiplexor 76B (2) accepts the eighth test point 78 (8), 78 (26) . . . 78 (548), and 78 (566) from each of the 32 groups, and so on, and the last multiplexor 76B (6) accepts the twelfth test point 78 (12), 78 (30) . . . 78 (552), and 78 (570) from each of the 32 groups. Given this arrangement, when the select register 80B chooses the first bit on each multiplexor 76B (1)–76B (6), the first group of the middle set of six internal test points 78 (7–12) is selected and delivered to the test pins 74 (7–12). The remaining groups are similarly chosen, e.g., when the select register 80B chooses the last bit on each multiplexor 76B (1)–76B (6), the last group of the middle set of six internal test points 78 (565–570) is selected and delivered to the test pins 74 (7–12).

Finally, in the last group of multiplexors 76C, the first multiplexor 76C (1) accepts the thirteenth test point 78 (13), 78 (31) . . . 78 (553), and 78 (571) from each of the 32 groups, the second multiplexor 76C (2) accepts the fourteenth test point 78 (14), 78 (32) . . . 78 (554), and 78 (572) from each of the 32 groups, and so on, and the last multiplexor 76C (6) accepts the eighteenth test point 78 (18), 78 (36) . . . 78 (558), and 78 (576) from each of the 32 groups. Given this arrangement, when the select register 80C chooses the first bit on each multiplexor 76C (1)–76C (6), the first group of the last set of six internal test points 78 (13–18) is selected and delivered to the test pins 74 (13–18). The remaining groups are similarly chosen, e.g., when the select register 80C chooses the last bit on each multiplexor 76C (1)–76C (6), the last group of the last set of six internal test points 78 (571–576) is selected and delivered to the test pins 74 (13–18).

The test pins 74 may display the data that is collected from the internal test points 78 as set forth in Table 2 below. As discussed above, which group of the internal test points 78 that is displayed depends on the selection made by the select registers 80A, 80B, and 80C. Thus, the Table 2 is divided into 18 columns for the 18 test pins 74 and 32 rows for the 32 groups of internal test points 78. The row numbering starts with first three groups of internal test points 78 (1–6), 78 (7–12), and 78 (13–18) in Row 1 and ends with the last three groups of internal test points 78 (559–564), 78 (565–570), and 78 (571–576) in Row 32. The select register 80A determines which row's first six signals are selected to be displayed on the test pins 74 (1–6), the select register 80B determines which row's middle six signals are selected to be displayed on the test pins 74 (7–12), and the select register 80C determines which row's last six signals are selected to be displayed on the test pins 74 (13–18). The select registers 80A, 80B, and 80C may be adjusted by the software to allow different rows to be selected within Table 2. In contrast to the operation of the first test circuit 53 depicted in Table 1, where only one row could be selected at any given time, the test circuit 70 can select sets of six signals from three different rows. For example, Table 2 illustrates the selection of Row 6 for the first set, Row 31 for the second set, and Row 17 for the third set. However, it should still be noted that if one or more signals in a set of signals in one row would be useful or necessary to debug a particular problem, but one or more signals in the same set of signals in another row or rows would also be useful or necessary to debug the problem, the debugger will still be at a disadvantage because all of the useful signals cannot be presented at the same time.

TABLE 2

|    | 1 | 2 | 3 | 4 | 5 | 6 | 7 | 8 | 9 | 10 | 11 | 12 | 13 | 14 | 15 | 16 | 17 | 18 |
|----|---|---|---|---|---|---|---|---|---|----|----|----|----|----|----|----|----|----|
| 1  | 1 | 2 | 3 | 4 | 5 | 6 | 7 | 8 | 9 | 10 | 11 | 12 | 13 | 14 | 15 | 16 | 17 | 18 |
| 2  | 19 | 20 | 21 | 22 | 23 | 24 | 25 | 26 | 27 | 28 | 29 | 30 | 31 | 32 | 33 | 34 | 35 | 36 |
| 3  | 37 | 38 | 39 | 40 | 41 | 42 | 43 | 44 | 45 | 46 | 47 | 48 | 49 | 50 | 51 | 52 | 53 | 54 |
| 4  | 55 | 56 | 57 | 58 | 59 | 60 | 61 | 62 | 63 | 64 | 65 | 66 | 67 | 68 | 69 | 70 | 71 | 72 |
| 5  | 73 | 74 | 75 | 76 | 77 | 78 | 79 | 80 | 81 | 82 | 83 | 84 | 85 | 86 | 87 | 88 | 89 | 90 |
| 6  | *91* | *92* | *93* | *94* | *95* | *96* | 97 | 98 | 99 | 100 | 101 | 102 | 103 | 104 | 105 | 106 | 107 | 108 |
| 7  | 109 | 110 | 111 | 112 | 113 | 114 | 115 | 116 | 117 | 118 | 119 | 120 | 121 | 122 | 123 | 124 | 125 | 126 |
| 8  | 127 | 128 | 129 | 130 | 131 | 132 | 133 | 134 | 135 | 136 | 137 | 138 | 139 | 140 | 141 | 142 | 143 | 144 |
| 9  | 145 | 146 | 147 | 148 | 149 | 150 | 151 | 152 | 153 | 154 | 155 | 156 | 157 | 158 | 159 | 160 | 161 | 162 |
| 10 | 163 | 164 | 165 | 166 | 167 | 168 | 169 | 170 | 171 | 172 | 173 | 174 | 175 | 176 | 177 | 178 | 179 | 180 |
| 11 | 181 | 182 | 183 | 184 | 185 | 186 | 187 | 188 | 189 | 190 | 191 | 192 | 193 | 194 | 195 | 196 | 197 | 198 |
| 12 | 199 | 200 | 201 | 202 | 203 | 204 | 205 | 206 | 207 | 208 | 209 | 210 | 211 | 212 | 213 | 214 | 215 | 216 |
| 13 | 217 | 218 | 219 | 220 | 221 | 222 | 223 | 224 | 225 | 226 | 227 | 228 | 229 | 230 | 231 | 232 | 233 | 234 |
| 14 | 235 | 236 | 237 | 238 | 239 | 240 | 241 | 242 | 243 | 244 | 245 | 246 | 247 | 248 | 249 | 250 | 251 | 252 |
| 15 | 253 | 254 | 255 | 256 | 257 | 258 | 259 | 260 | 261 | 262 | 263 | 264 | 265 | 266 | 267 | 268 | 269 | 270 |
| 16 | 271 | 272 | 273 | 274 | 275 | 276 | 277 | 278 | 279 | 280 | 281 | 282 | 283 | 284 | 285 | 286 | 287 | 288 |

TABLE 2-continued

| 17 | 289 | 290 | 291 | 292 | 293 | 294 | 295 | 296 | 297 | 298 | 299 | 300 | 301 | 302 | 303 | 304 | 305 | 306 |
| --- | --- | --- | --- | --- | --- | --- | --- | --- | --- | --- | --- | --- | --- | --- | --- | --- | --- | --- |
| 18 | 307 | 308 | 309 | 310 | 311 | 312 | 313 | 314 | 315 | 316 | 317 | 318 | 319 | 320 | 321 | 322 | 323 | 324 |
| 19 | 325 | 326 | 327 | 328 | 329 | 330 | 331 | 332 | 333 | 334 | 335 | 336 | 337 | 338 | 339 | 340 | 341 | 342 |
| 20 | 343 | 344 | 345 | 346 | 347 | 348 | 349 | 350 | 351 | 352 | 353 | 354 | 355 | 356 | 357 | 358 | 359 | 360 |
| 21 | 361 | 362 | 363 | 364 | 365 | 366 | 367 | 368 | 369 | 370 | 371 | 372 | 373 | 374 | 375 | 376 | 377 | 378 |
| 22 | 379 | 380 | 381 | 382 | 383 | 384 | 385 | 386 | 387 | 388 | 389 | 390 | 391 | 392 | 393 | 394 | 395 | 396 |
| 23 | 397 | 398 | 399 | 400 | 401 | 402 | 403 | 404 | 405 | 406 | 407 | 408 | 409 | 410 | 411 | 412 | 413 | 414 |
| 24 | 415 | 416 | 417 | 418 | 419 | 420 | 421 | 422 | 423 | 424 | 425 | 426 | 427 | 428 | 429 | 430 | 431 | 432 |
| 25 | 433 | 434 | 435 | 436 | 437 | 438 | 439 | 440 | 441 | 442 | 443 | 444 | 445 | 446 | 447 | 448 | 449 | 450 |
| 26 | 451 | 452 | 453 | 454 | 455 | 456 | 457 | 458 | 459 | 460 | 461 | 462 | 463 | 464 | 465 | 466 | 467 | 468 |
| 27 | 469 | 470 | 471 | 472 | 473 | 474 | 475 | 476 | 477 | 478 | 479 | 480 | 481 | 482 | 483 | 484 | 485 | 486 |
| 28 | 487 | 488 | 489 | 490 | 491 | 492 | 493 | 494 | 495 | 496 | 497 | 498 | 499 | 500 | 501 | 502 | 503 | 504 |
| 29 | 505 | 506 | 507 | 508 | 509 | 510 | 511 | 512 | 513 | 514 | 515 | 516 | 517 | 518 | 519 | 520 | 521 | 522 |
| 30 | 523 | 524 | 525 | 526 | 527 | 528 | 529 | 530 | 531 | 532 | 533 | 534 | 535 | 536 | 537 | 538 | 539 | 540 |
| 31 | 541 | 542 | 543 | 544 | 545 | 546 | 547 | 548 | 549 | 550 | 551 | 552 | 553 | 554 | 555 | 556 | 557 | 558 |
| 32 | 559 | 560 | 561 | 562 | 563 | 564 | 565 | 566 | 567 | 568 | 569 | 570 | 571 | 572 | 573 | 574 | 575 | 576 |

Figure 5:
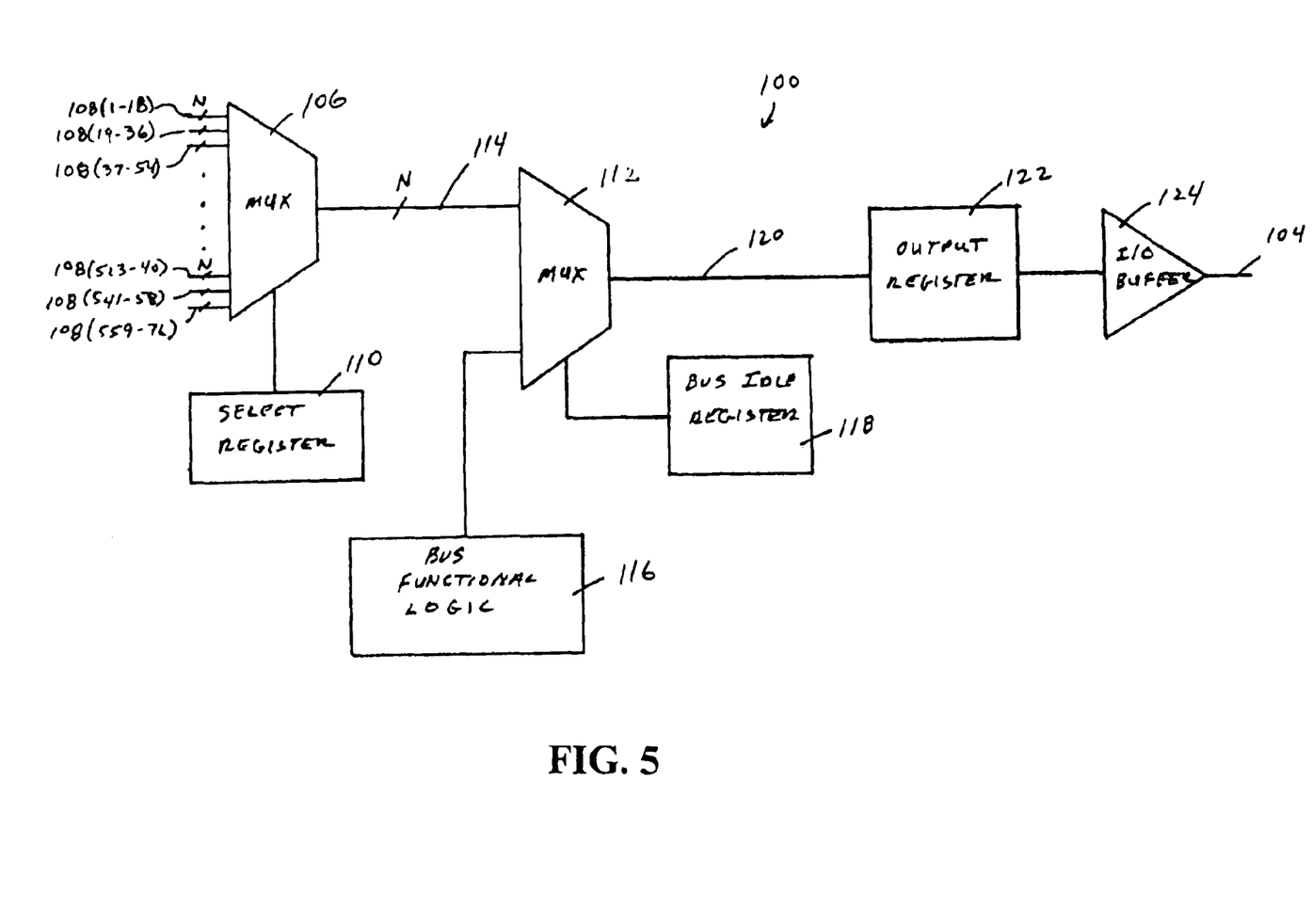
FIG. 5 illustrates a schematic diagram of a test mulitplexor having a single select and being coupled to a bus in accordance with the present invention.

As is clear from the discussion above, although the test circuits 53 and 70 may prove quite useful in debugging operations, their usefulness is somewhat limited by the number of test pins. Using a greater number of test pins may tend to alleviate this problem, but, as discussed, the pin count of an integrated circuit tends to increase the size of the circuit. Thus, designers are typically hesitant to add pins. To address these concerns, a test circuit 100 that uses no dedicated test pins is illustrated in FIG. 5. As described in detail below, the test circuit 100 utilizes an idle bus instead of test pins to provide a debugger with useful information. Thus, the debugger can gain information similar to the information described above without the integrated circuit being burdened with test pins.

For the sake of simplicity, the test circuit 100 will be described using the running example discussed above, i.e., 576 internal data points will be output on 18 pins. However, it should be understood that the number of output pins will be limited by the number of idle bus outputs available. Thus, for a 32-bit bus, for example, up to 32 test outputs may be used.

One or more of the integrated circuits illustrated in FIG. 2, such as the processor 42 and/or the bridge 44, may include the test circuit 100. Similar to the test circuit 53, the test circuit 100 includes output pins 104 that are operatively coupled to the output of a multiplexor circuit 106, and a plurality of internal test points 108 that are coupled to the input of the multiplexors circuit 106. There are N output pins 104, where N is an integer. In this example, N equals 18, but it should be understood that the actual number of output pins 104 may vary depending on the number of available idle bus outputs. The multiplexor circuit 106 is typically chosen to have a multiplexing ratio R:1 sufficient to handle the number of desired internal test points 108. In this example, the number of desired internal test points 108 equals 576. Therefore, in this example, the multiplexor circuit 106 has a multiplexing ratio of 32:1. Specifically, it should be understood that the internal test points 108 are organized into R groups of N signals—32 groups of 18 signals in this case. Thus, as illustrated in FIG. 5, the first three groups of internal test points are designated as 108 (1–18), 108 (19–36), and 108 (37–54), and the last three groups of internal test points are designated as 108 (523–540), 108 (541–558), and 108 (559–576), with the remaining 26 groups being similarly designated in between.

Also like the test circuit 53, the multiplexor circuit 106 is coupled to a select register 110. The select register 110 can be loaded with information, such as a binary number, which selects one of the R groups of internal data points 108 to be sent to the output pins 104. In keeping with the running example, to select among 32 groups using binary numbers, the select register 110 may be five bits wide. Therefore, to select the first group of internal test points 108 (1–18), the debugger would load the select register 110 with the binary number 00000, and to select the last group of internal test points 108 (559–576), the debugger would load the select register 110 with the binary number 11111. Thus, any of the 32 groups of 18 internal test points 108 may be displayed to the debugger in the same manner as set forth above in Table 1.

Unlike the previously described test circuit 53, however, the output pins 104 are not dedicated to the multiplexor circuit 106. Rather, the output pins 104 belong to a bus, and the multiplexor circuit 106 merely utilizes this bus when it is idle. For example, the bus may comprise a point-to-point bus. As a result of the point-to-point bus being dedicated between two circuits, the point-to-point bus is usually idle more frequently than a shared bus. Accordingly, the test circuit 100 may include a second multiplexor circuit or switch 112. The outputs 114 of the multiplexor circuit 106 are fed into one input of the multiplexor circuit 112, and the normal user or users of the bus, described here as bus functional logic 116, are fed into the other input of the multiplexor circuit 112. The multiplexor circuit 112 is coupled to a select register, designated as a bus idle register 118. Since the multiplexor circuit 112 is illustrated as a 2:1 multiplexor in this embodiment, the bus idle register 118 may comprise only a single bit to select between the input from the multiplexor circuit 106 and the input from the bus functional logic 116.

When the bus is requested by the bus functional logic 116, the bus idle register 118 selects the input from the bus functional logic 116. Accordingly, the signals from the bus functional logic 116 are delivered at the output 120 of the multiplexor circuit 112. These signals may be delivered through an output register 122 and an I/O buffer 124 to the output pins 104. When the bus is not requested by the bus functional logic 116, however, the bus is detected as being idle. Thus, the bus idle register 118 selects the input from the multiplexor circuit 106. Accordingly, the signals from the multiplexor circuit 106 are delivered at the output 120 of the multiplexor circuit 112. These signals may also be delivered through the output register 122 and the I/O buffer 124 to the output pins 104. Thus, when the bus is idle, a debugger can obtain internal test points on the bus using the test circuit 100.

It should be understood that the detailed arrangement of the multiplexor circuit 106 may be like the detailed arrangement described above in reference to FIG. 3B. Thus, there is no need to repeat such description here. Furthermore, those skilled in the art will recognize that the detailed arrangement of the multiplexor circuit 112 may also be similar and that it may be dependent upon the number of lines of the bus used by the multiplexor circuit 106. Finally, while the multiplexor circuit 112 multiplexes the selected internal data points onto one bus, it should be understood that multiple multiplexor circuits 112 and registers 118 may monitor multiple busses and multiplex the selected internal test points onto any of the multiple busses that is available by virtue of its idle status.

Figure 6:
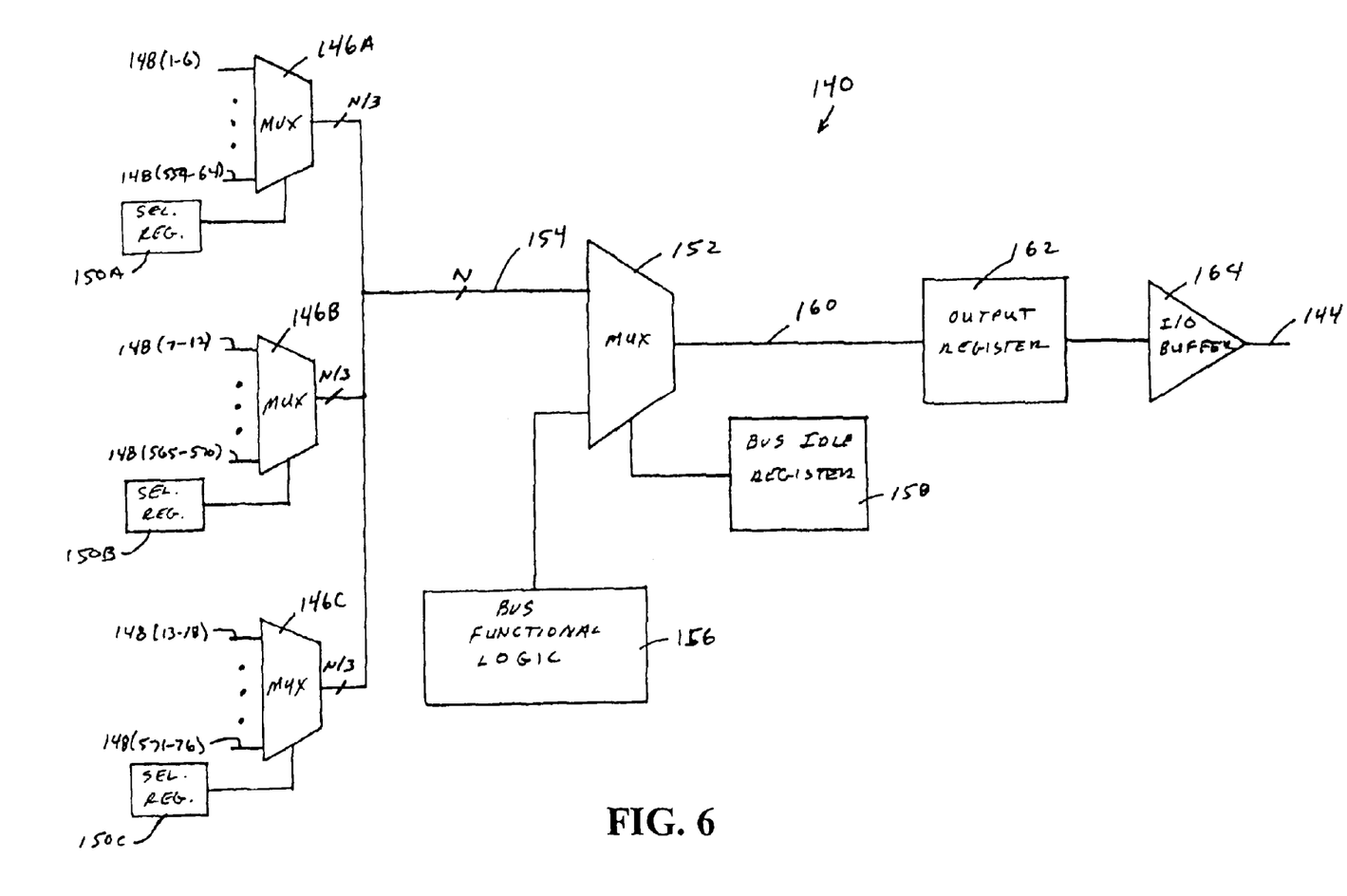
FIG. 6 illustrates a schematic diagram of a test multiplexor having multiple selects and being coupled to a bus in accordance with the present invention.

To increase the flexibility of the selection of the internal test points 108, an alternate test circuit 140 may be used, as illustrated in FIG. 6. The test circuit 140 operates quite similarly to the test circuit 100, except that it uses multiple selects rather than a single select in a manner similar to the test circuit 70. The test circuit includes output pins 144 that are operatively coupled to the output of multiple multiplexor circuits 146, and a plurality of internal test points 148 that are coupled to the input of the multiple multiplexors circuits 146. There are N output pins 144, where N is an integer. In this example, N equals 18, but the actual number of output pins 144 may vary substantially and depend on the number of outputs available on the idle bus. Furthermore, in this example, three multiplexor circuits 146A, 146B, and 146C are used, so that the 18 test pins 144 may be divided into three sets 144 (1–6), 144 (7–12), and 144 (13–18) capable of outputting six internal data points apiece.

Each multiplexor circuit 146A, 146B, and 146C is typically chosen to have a multiplexing ratio R:1 sufficient to handle the number of desired internal test points 148. In keeping with the running example, the number of desired internal test points 148 equals 576. Therefore, in this example, each of the three multiplexor circuits 146A, 146B, and 146C has a multiplexing ratio of 32:1. As in the previously described test circuit 100, the internal data points 148 are organized into R groups of N signals—32 groups of 18 signals in this case. Also, because of the multiple multiplexor circuits 146A, 146B, and 146C, the 18 signals are divided into three sets of six. Thus, as illustrated in FIG. 6, the first three groups of internal test points on the first multiplexor circuit 146A are designated as 148 (1–6), 148 (19–24), and 148 (37–42), and the last three groups of internal data points are designated as 148 (523–528), 148 (541–546), and 148 (559–564), with the remaining 26 groups being similarly designated in between; the first three groups of internal test points on the second multiplexor circuit 146B are designated as 148 (7–12), 148 (25–30), and 148 (43–last three groups of internal test points are designated as 148 (529–534), 148 (547–552), and 148 (565–570), with the remaining 26 groups being similarly designated in between; and the first three groups of internal test points on the third multiplexor circuit 146C are designated as 148 (13–18), 148 (31–36), and 148 (49–54), and the last three groups of internal test points are designated as 148 (535–540), 148 (553–558), and 148 (571–576), with the remaining 26 groups being similarly designated in between.

Each of the multiplexor circuits 146A, 146B, and 146C is coupled to a respective select register 150A, 150B, and 150C. The select registers 150A, 150B, and 150C can be loaded with information, such as a binary number, which selects one of the R groups of internal data points 148 to be sent to the output pins 144. In keeping with the running example, to select among 32 groups using binary numbers, each select register 150A, 150B, and 150C may be five bits wide. Therefore, to select the first group of internal test points 148 (1–6) on the first multiplexor circuit 146A, the debugger would load the select register 150A with the binary number 00000, and to select the last group of internal test points 148 (559–564), the debugger would load the select register 150A with the binary number 11111. Similarly, to select the first group of internal test points 148 (7–12) on the second multiplexor circuit 146B, the debugger would load the select register 150B with the binary number 00000, and to select the last group of internal test points 148 (565–570), the debugger would load the select register 150B with the binary number 11111. Finally, to select the first group of internal test points 148 (13–18) on the third multiplexor circuit 146C, the debugger would load the select register 150C with the binary number 00000, and to select the last group of internal test points 148 (571–576), the debugger would load the select register 150C with the binary number 11111. Thus, as in the previous example, any of the 32 groups of 18 internal test points 148 may be displayed to the debugger. However, flexibility is further facilitated (as described above with respect to Table 2) because the 18 internal test points 148 selected need not all be in the same row.

Unlike the previously described test circuits 53 and 70, however, the output pins 144 are not dedicated to the multiplexor circuits 146A, 146B, and 146C. Rather, the output pins 144 belong to a bus, and the multiplexor circuits 146 merely utilize this bus when it is idle. Accordingly, the test circuit 140 may include a second multiplexor circuit or switch 152. The outputs 154 of the multiplexor circuits 146 are fed into one input of the multiplexor circuit 152, and the normal user or users of the bus, described here as bus functional logic 156, are fed into the other input of the multiplexor circuit 152. The multiplexor circuit 152 is coupled to a select register, designated as a bus idle register 158. Since the multiplexor circuit 152 is illustrated as a 2:1 multiplexor in this embodiment, the bus idle register 158 may comprise only a single bit to select between the input from the multiplexor circuits 146 and the input from the bus functional logic 156.

When the bus is requested by the bus functional logic 156, the bus idle register 158 selects the input from the bus functional logic 156. Accordingly, the signals from the bus functional logic 156 are delivered at the output 160 of the multiplexor circuit 152. These signals may be delivered through an output register 162 and an I/O buffer 164 to the output pins 144. When the bus is not requested by the bus functional logic 156, however, the bus is detected as being idle. Thus, the bus idle register 158 selects the input from the multiplexor circuits 146. Accordingly, the signals from the multiplexor circuits 146 are delivered at the output 160 of the multiplexor circuit 152. These signals may also be delivered through the output register 162 and the I/O buffer 164 to the output pins 144. Thus, when the bus is idle, a debugger can obtain internal data points on the bus using the test circuit 140.

It should be understood that the detailed arrangement of the multiplexor circuits 146 may be like the detailed arrangement described above in reference to FIG. 4B. Thus, there is no need to repeat such description here. Furthermore, those skilled in the art will recognize that the detailed arrangement of the multiplexor circuit 152 may also be similar, and that it may be dependent upon the number of lines of the bus used by the multiplexor circuits 146. Finally, while the multiplexor circuit 152 multiplexes the selected internal data points onto one bus, it should be understood that multiple multiplexor circuits 152 and registers 158 may monitor multiple busses and multiplex the selected internal data points onto any one of the multiple busses that is available by virtue of its idle status.

As alluded to above, the test circuits 100 and/or 140 may be used instead of the test circuits 53 and/or 70. In comparison, the resulting integrated circuit having the test circuit 100 and/or 140 will still have the debugging and testing capability of an integrated circuit having the test circuit 53 and/or 70. However, unlike an integrated circuit having the test circuit 53 and/or 70, an integrated circuit having the test circuit 100 and/or 140 instead will not have any dedicated test pins. Thus, test circuits that utilize an idle bus instead of dedicated test pins can reduce the size of the integrated circuit while providing similar functionality.

Figure 7:
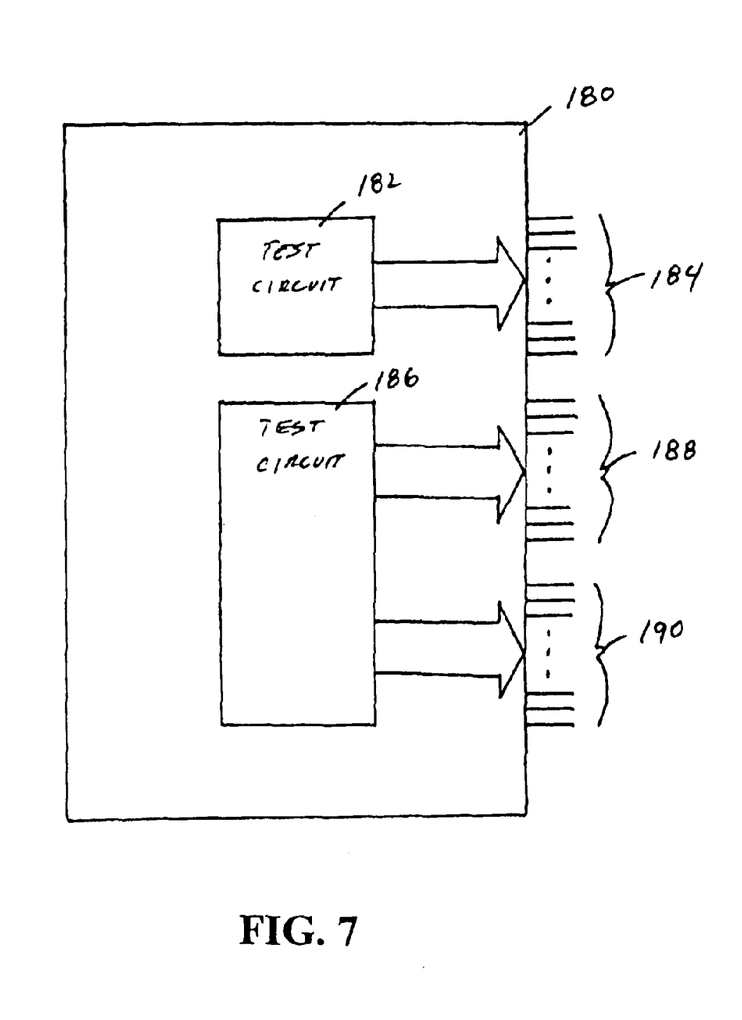
FIG. 7 illustrates a block diagram of at least one test multiplexor having single or multiple selects and being coupled to a bus in combination with a test multiplexor having single or multiple selects and being coupled to a plurality of test pins in accordance with the present invention.

Although a test circuit that utilizes an idle bus can be substituted for a test circuit that utilizes dedicated test pins, these circuits can be used together as well. As illustrated in FIG. 7, an integrated circuit 180 can have multiple test circuits. In this example, the integrated circuit 180 includes at least two test circuits. The first test circuit 182 may be like the test circuit 53 or 70 and utilize dedicated test pins 184. The second test circuit 186 may be like the test circuit 100 or 140 and utilize one or more busses 188 and 190. In keeping with the running example, the 576 internal test points are coupled to each of the test circuits 182 and 186. The first test circuit 182 will operate as described above and output 18 selected internal test points on the test pins 184, as illustrated by way of example in Table 3.

TABLE 3

|    | 1   | 2   | 3   | 4   | 5   | 6   | 7   | 8   | 9   | 10  | 11  | 12  | 13  | 14  | 15  | 16  | 17  | 18  |
|----|-----|-----|-----|-----|-----|-----|-----|-----|-----|-----|-----|-----|-----|-----|-----|-----|-----|-----|
| 1  | 1   | 2   | 3   | 4   | 5   | 6   | 7   | 8   | 9   | 10  | 11  | 12  | 13  | 14  | 15  | 16  | 17  | 18  |
| 2  | 19  | 20  | 21  | 22  | 23  | 24  | 25  | 26  | 27  | 28  | 29  | 30  | 31  | 32  | 33  | 34  | 35  | 36  |
| 3  | 37  | 38  | 39  | 40  | 41  | 42  | 43  | 44  | 45  | 46  | 47  | 48  | 49  | 50  | 51  | 52  | 53  | 54  |
| 4  | 55  | 56  | 57  | 58  | 59  | 60  | 61  | 62  | 63  | 64  | 65  | 66  | 67  | 68  | 69  | 70  | 71  | 72  |
| 5  | 73  | 74  | 75  | 76  | 77  | 78  | 79  | 80  | 81  | 82  | 83  | 84  | 85  | 86  | 87  | 88  | 89  | 90  |
| 6  | 91  | 92  | 93  | 94  | 95  | 96  | 97  | 98  | 99  | 100 | 101 | 102 | 103 | 104 | 105 | 106 | 107 | 108 |
| 7  | 109 | 110 | 111 | 112 | 113 | 114 | 115 | 116 | 117 | 118 | 119 | 120 | 121 | 122 | 123 | 124 | 125 | 126 |
| 8  | 127 | 128 | 129 | 130 | 131 | 132 | 133 | 134 | 135 | 136 | 137 | 138 | 139 | 140 | 141 | 142 | 143 | 144 |
| 9  | 145 | 146 | 147 | 148 | 149 | 150 | 151 | 152 | 153 | 154 | 155 | 156 | 157 | 158 | 159 | 160 | 161 | 162 |
| 10 | 163 | 164 | 165 | 166 | 167 | 168 | 169 | 170 | 171 | 172 | 173 | 174 | *175* | *176* | *177* | *178* | *179* | *180* |
| 11 | 181 | 182 | 183 | 184 | 185 | 186 | 187 | 188 | 189 | 190 | 191 | 192 | 193 | 194 | 195 | 196 | 197 | 198 |
| 12 | 199 | 200 | 201 | 202 | 203 | 204 | 205 | 206 | 207 | 208 | 209 | 210 | 211 | 212 | 213 | 214 | 215 | 216 |
| 13 | 217 | 218 | 219 | 220 | 221 | 222 | 223 | 224 | 225 | 226 | 227 | 228 | 229 | 230 | 231 | 232 | 233 | 234 |
| 14 | 235 | 236 | 237 | 238 | 239 | 240 | 241 | 242 | 243 | 244 | 245 | 246 | 247 | 248 | 249 | 250 | 251 | 252 |
| 15 | 253 | 254 | 255 | 256 | 257 | 258 | 259 | 260 | 261 | 262 | 263 | 264 | 265 | 266 | 267 | 268 | 269 | 270 |
| 16 | 271 | 272 | 273 | 274 | 275 | 276 | 277 | 278 | 279 | 280 | 281 | 282 | 283 | 284 | 285 | 286 | 287 | 288 |
| 17 | 289 | 290 | 291 | 292 | 293 | 294 | 295 | 296 | 297 | 298 | 299 | 300 | 301 | 302 | 303 | 304 | 305 | 306 |
| 18 | 307 | 308 | 309 | 310 | 311 | 312 | *313* | *314* | *315* | *316* | *317* | *318* | 319 | 320 | 321 | 322 | 323 | 324 |
| 19 | 325 | 326 | 327 | 328 | 329 | 330 | 331 | 332 | 333 | 334 | 335 | 336 | 337 | 338 | 339 | 340 | 341 | 342 |
| 20 | 343 | 344 | 345 | 346 | 347 | 348 | 349 | 350 | 351 | 352 | 353 | 354 | 355 | 356 | 357 | 358 | 359 | 360 |
| 21 | 361 | 362 | 363 | 364 | 365 | 366 | 367 | 368 | 369 | 370 | 371 | 372 | 373 | 374 | 375 | 376 | 377 | 378 |
| 22 | 379 | 380 | 381 | 382 | 383 | 384 | 385 | 386 | 387 | 388 | 389 | 390 | 391 | 392 | 393 | 394 | 395 | 396 |
| 23 | 397 | 398 | 399 | 400 | 401 | 402 | 403 | 404 | 405 | 406 | 407 | 408 | 409 | 410 | 411 | 412 | 413 | 414 |
| 24 | *415* | *416* | *417* | *418* | *419* | *420* | 421 | 422 | 423 | 424 | 425 | 426 | 427 | 428 | 429 | 430 | 431 | 432 |
| 25 | 433 | 434 | 435 | 436 | 437 | 438 | 439 | 440 | 441 | 442 | 443 | 444 | 445 | 446 | 447 | 448 | 449 | 450 |
| 26 | 451 | 452 | 453 | 454 | 455 | 456 | 457 | 458 | 459 | 460 | 461 | 462 | 463 | 464 | 465 | 466 | 467 | 468 |
| 27 | 469 | 470 | 471 | 472 | 473 | 474 | 475 | 476 | 477 | 478 | 479 | 480 | 481 | 482 | 483 | 484 | 485 | 486 |
| 28 | 487 | 488 | 489 | 490 | 491 | 492 | 493 | 494 | 495 | 496 | 497 | 498 | 499 | 500 | 501 | 502 | 503 | 504 |
| 29 | 505 | 506 | 507 | 508 | 509 | 510 | 511 | 512 | 513 | 514 | 515 | 516 | 517 | 518 | 519 | 520 | 521 | 522 |
| 30 | 523 | 524 | 525 | 526 | 527 | 528 | 529 | 530 | 531 | 532 | 533 | 534 | 535 | 536 | 537 | 538 | 539 | 540 |
| 31 | 541 | 542 | 543 | 544 | 545 | 546 | 547 | 548 | 549 | 550 | 551 | 552 | 553 | 554 | 555 | 556 | 557 | 558 |
| 32 | 559 | 560 | 561 | 562 | 563 | 564 | 565 | 566 | 567 | 568 | 569 | 570 | 571 | 572 | 573 | 574 | 575 | 576 |

Similarly, as illustrated by way of example in Table 4, the second test circuit 186 will operate as described above and output a different 18 selected internal test points on the bus 188 and/or 190 whenever the busses 188 and/or 190 are idle. Thus, in this example, using no more pins than an integrated circuit having only the first test circuit 182, a debugger can view two or three times as many internal test points.

TABLE 4

|    | 1 | 2 | 3 | 4 | 5 | 6 | 7 | 8 | 9 | 10 | 11 | 12 | 13 | 14 | 15 | 16 | 17 | 18 |
|----|---|---|---|---|---|---|---|---|---|----|----|----|----|----|----|----|----|----|
| 1  | 1 | 2 | 3 | 4 | 5 | 6 | 7 | 8 | 9 | 10 | 11 | 12 | 13 | 14 | 15 | 16 | 17 | 18 |
| 2  | 19 | 20 | 21 | 22 | 23 | 24 | 25 | 26 | 27 | 28 | 29 | 30 | 31 | 32 | 33 | 34 | 35 | 36 |
| 3  | 37 | 38 | 39 | 40 | 41 | 42 | 43 | 44 | 45 | 46 | 47 | 48 | 49 | 50 | 51 | 52 | 53 | 54 |
| 4  | 55 | 56 | 57 | 58 | 59 | 60 | 61 | 62 | 63 | 64 | 65 | 66 | 67 | 68 | 69 | 70 | 71 | 72 |
| 5  | 73 | 74 | 75 | 76 | 77 | 78 | 79 | 80 | 81 | 82 | 83 | 84 | 85 | 86 | 87 | 88 | 89 | 90 |
| 6  | 91 | 92 | 93 | 94 | 95 | 96 | 97 | 98 | 99 | 100 | 101 | 102 | 103 | 104 | 105 | 106 | 107 | 108 |
| 7  | 109 | 110 | 111 | 112 | 113 | 114 | 115 | 116 | 117 | 118 | 119 | 120 | 121 | 122 | 123 | 124 | 125 | 126 |
| 8  | 127 | 128 | 129 | 130 | 131 | 132 | 133 | 134 | 135 | 136 | 137 | 138 | 139 | 140 | 141 | 142 | 143 | 144 |
| 9  | 145 | 146 | 147 | 148 | 149 | 150 | 151 | 152 | 153 | 154 | 155 | 156 | 157 | 158 | 159 | 160 | 161 | 162 |
| 10 | 163 | 164 | 165 | 166 | 167 | 168 | 169 | 170 | 171 | 172 | 173 | 174 | 175 | 176 | 177 | 178 | 179 | 180 |
| 11 | 181 | 182 | 183 | 184 | 185 | 186 | 187 | 188 | 189 | 190 | 191 | 192 | 193 | 194 | 195 | 196 | 197 | 198 |
| 12 | 199 | 200 | 201 | 202 | 203 | 204 | 205 | 206 | 207 | 208 | 209 | 210 | 211 | 212 | 213 | 214 | 215 | 216 |
| 13 | 217 | 218 | 219 | 220 | 221 | 222 | 223 | 224 | 225 | 226 | 227 | 228 | 229 | 230 | 231 | 232 | 233 | 234 |
| 14 | *235* | *236* | *237* | *238* | *239* | *240* | 241 | 242 | 243 | 244 | 245 | 246 | 247 | 248 | 249 | 250 | 251 | 252 |
| 15 | 253 | 254 | 255 | 256 | 257 | 258 | 259 | 260 | 261 | 262 | 263 | 264 | 265 | 266 | 267 | 268 | 269 | 270 |
| 16 | 271 | 272 | 273 | 274 | 275 | 276 | 277 | 278 | 279 | 280 | 281 | 282 | 283 | 284 | 285 | 286 | 287 | 288 |
| 17 | 289 | 290 | 291 | 292 | 293 | 294 | 295 | 296 | 297 | 298 | 299 | 300 | 301 | 302 | 303 | 304 | 305 | 306 |
| 18 | 307 | 308 | 309 | 310 | 311 | 312 | 313 | 314 | 315 | 316 | 317 | 318 | 319 | 320 | 321 | 322 | 323 | 324 |
| 19 | 325 | 326 | 327 | 328 | 329 | 330 | 331 | 332 | 333 | 334 | 335 | 336 | 337 | 338 | 339 | 340 | 341 | 342 |
| 20 | 343 | 344 | 345 | 346 | 347 | 348 | 349 | 350 | 351 | 352 | 353 | 354 | 355 | 356 | 357 | 358 | 359 | 360 |
| 21 | 361 | 362 | 363 | 364 | 365 | 366 | 367 | 368 | 369 | 370 | 371 | 372 | *373* | *374* | *375* | *376* | *377* | *378* |
| 22 | 379 | 380 | 381 | 382 | 383 | 384 | 385 | 386 | 387 | 388 | 389 | 390 | 391 | 392 | 393 | 394 | 395 | 396 |
| 23 | 397 | 398 | 399 | 400 | 401 | 402 | 403 | 404 | 405 | 406 | 407 | 408 | 409 | 410 | 411 | 412 | 413 | 414 |
| 24 | 415 | 416 | 417 | 418 | 419 | 420 | *421* | *422* | *423* | *424* | *425* | *426* | 427 | 428 | 429 | 430 | 431 | 432 |
| 25 | 433 | 434 | 435 | 436 | 437 | 438 | 439 | 440 | 441 | 442 | 443 | 444 | 445 | 446 | 447 | 448 | 449 | 450 |
| 26 | 451 | 452 | 453 | 454 | 455 | 456 | 457 | 458 | 459 | 460 | 461 | 462 | 463 | 464 | 465 | 466 | 467 | 468 |
| 27 | 469 | 470 | 471 | 472 | 473 | 474 | 475 | 476 | 477 | 478 | 479 | 480 | 481 | 482 | 483 | 484 | 485 | 486 |
| 28 | 487 | 488 | 489 | 490 | 491 | 492 | 493 | 494 | 495 | 496 | 497 | 498 | 499 | 500 | 501 | 502 | 503 | 504 |
| 29 | 505 | 506 | 507 | 508 | 509 | 510 | 511 | 512 | 513 | 514 | 515 | 516 | 517 | 518 | 519 | 520 | 521 | 522 |
| 30 | 523 | 524 | 525 | 526 | 527 | 528 | 529 | 530 | 531 | 532 | 533 | 534 | 535 | 536 | 537 | 538 | 539 | 540 |
| 31 | 541 | 542 | 543 | 544 | 545 | 546 | 547 | 548 | 549 | 550 | 551 | 552 | 553 | 554 | 555 | 556 | 557 | 558 |
| 32 | 559 | 560 | 561 | 562 | 563 | 564 | 565 | 566 | 567 | 568 | 569 | 570 | 571 | 572 | 573 | 574 | 575 | 576 |

Of course, as discussed above, the number of internal test points that may be output using the second test circuit 186 may vary depending on the size of the busses 188 and 190 and may be different from the number of internal test points output by the first test circuit 182 on the dedicated test pins 184. For example, assuming that an integrated circuit has at least one 32-bit bus available for outputting internal test points using the test circuit 186, but only room for twelve dedicated test pins for the test circuit 182, the debugger would be able to view up to 44 different internal test points using the dedicated test pins and one of the idle busses.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A test circuit comprising:
   a bus; and
   a multiplexing circuit having a plurality of inputs correlative to internal test points of an integrated circuit, the multiplexing circuit adapted to deliver a group of the internal test points onto the bus to debug the operation of the integrated circuit during an idle state of the bus and while the integrated circuit is operational.

2. The test circuit, as set forth in claim 1, wherein the bus comprises a point-to-point bus.

3. The test circuit, as set forth in claim 1, comprising multiple busses, wherein the multiplexing circuit is adapted to deliver the group of the internal test points onto a respective one of the multiple busses during an idle state of the respective bus.

4. The test circuit, as set forth in claim 1, wherein the multiplexing circuit comprises a single select register to select one set of R groups of the internal test points.

5. The test circuit, as set forth in claim 1, wherein the multiplexing circuit comprises multiple select registers to select multiple sets of R groups of the internal test points.

6. The test circuit, as set forth in claim 1, wherein the multiplexing circuit comprises a switch to couple the group of internal test points to the bus during the idle state of the bus.

7. An integrated circuit comprising:

a plurality of test pins;

a first test circuit having a plurality of inputs correlative to internal test points of the integrated circuit, the first test circuit adapted to deliver a first group of the internal test points onto the plurality of test pins;

a bus; and a second test circuit having a plurality of inputs correlative to the internal test points, the second test circuit adapted to deliver a second group of the internal test points onto the bus to debug the operation of the integrated circuit during an idle state of the bus and while the integrated circuit is operational.

8. The circuit, as set forth in claim 7, wherein the plurality of test pins are dedicated to delivering the internal test points.

9. The circuit, as set forth in claim 7, wherein the bus comprises a point-to-point bus.

10. The circuit, as set forth in claim 7, comprising multiple busses, wherein the second test circuit is adapted to deliver the second group of the internal test points onto a respective one of the multiple busses during an idle state of the respective bus.

11. The circuit, as set forth in claim 7, wherein the first test circuit comprises a first multiplexing circuit and the second test circuit comprises a second multiplexing circuit.

12. The circuit, as set forth in claim 11, wherein the first multiplexing circuit comprises a single select register to select one set of R first groups of the internal test points, and wherein the second multiplexing circuit comprises a single select register to select one set of R second groups of the internal test points.

13. The circuit, as set forth in claim 11, wherein the first multiplexing circuit comprises multiple select registers to select multiple sets of R first groups of the internal test points, and wherein the second multiplexing circuit comprises multiple select registers to select multiple sets of R second groups of the internal test points.

14. The circuit, as set forth in claim 7, wherein the second test circuit comprises a switch to couple the group of internal test points to the bus during the idle state of the bus.

15. A method of testing a circuit, the method comprising the act of:

multiplexing a plurality of internal test signals onto an idle bus coupled to output pins of the circuit to debug the operation of the circuit while operational.

16. The method, as set forth in claim 15, wherein the act of multiplexing comprises the act of:

coupling a plurality of groups of internal test signals to a multiplexing circuit.

17. The method, as set forth in claim 16, wherein the act of multiplexing comprises the act of:

selecting one of the plurality of groups of internal test signals.

18. The method, as set forth in claim 17, wherein the act of multiplexing comprises the act of:

delivering the selected one of the plurality of groups of internal test signals onto the idle bus.

19. A method of testing a circuit, the method comprising the acts of:

multiplexing a first plurality of internal test signals onto a plurality of dedicated test pins of the circuit; and multiplexing a second plurality of internal test signals onto an idle bus coupled to output pins of the circuit to debug the operation of the circuit while operational.

20. The method, as set forth in claim 19, wherein the acts of multiplexing comprise the act of coupling a plurality of groups of internal test signals to a first multiplexing circuit and to a second multiplexing circuit.

21. The method, as set forth in claim 20, wherein the act of multiplexing the first plurality of internal test signals comprises the act of:

selecting one of the plurality of groups of internal test signals coupled to the first multiplexing circuit.

22. The method, as set forth in claim 21, wherein the act of multiplexing the second plurality of internal test signals comprises the act of:

selecting one of the plurality of groups of internal test signals coupled to the second multiplexing circuit.

23. The method, as set forth in claim 21, wherein the group of internal test signals selected by the first multiplexing circuit is different than the group of internal test signals selected by the second multiplexing circuit.

24. The method, as set forth in claim 23, wherein the act of multiplexing the second plurality of internal test signals comprises the act of:

delivering the selected one of the plurality of groups of internal test signals from the second multiplexing circuit onto the idle bus.

25. A circuit testing apparatus comprising:

a circuit under test, the circuit under test having an integrated circuit comprising a bus and a multiplexing circuit, the multiplexing circuit having a plurality of inputs correlative to internal test points of the integrated circuit, the multiplexing circuit adapted to deliver a group of the internal test points onto the bus to debug the operation of the integrated circuit during an idle state of the bus and while the integrated circuit is operational; and a testing device external to the integrated circuit and operatively coupled to the bus to receive the group of the internal test points.

26. The apparatus, as set forth in claim 25, wherein the bus comprises a point-to-point bus.

27. The apparatus, as set forth in claim 25, comprising multiple busses, wherein the multiplexing circuit is adapted to deliver the group of the internal test points onto a respective one of the multiple busses during an idle state of the respective bus.

28. The apparatus, as set forth in claim 25, wherein the multiplexing circuit comprises a single select register to select one set of R groups of the internal test points.

29. The apparatus, as set forth in claim 25, wherein the multiplexing circuit comprises multiple select registers to select multiple sets of R groups of the internal test points.

30. The apparatus, as set forth in claim 25, wherein the multiplexing circuit comprises a switch to couple the group of internal test points to the bus during the idle state of the bus.

31. The apparatus, as set forth in claim 25, wherein the testing device comprises a logic analyzer.

32. The apparatus, as set forth in claim 25, wherein the testing device comprises an in-circuit emulator.

33. A circuit testing apparatus comprising:

a circuit under test comprising an integrated circuit, wherein the integrated circuit comprises:

a plurality of test pins;

a first test circuit having a plurality of inputs correlative to internal test points of the integrated circuit, the first test circuit adapted to deliver a first group of the internal test points onto the plurality of test pins;

a bus; and a second test circuit having a plurality of inputs correlative to the internal test points, the second test circuit adapted to deliver a second group of the internal test points onto the bus to debug the operation of the integrated circuit during an idle state of the bus and while the integrated circuit is operational; and a testing device external to the integrated circuit and operatively coupled to the bus to receive the group of the internal test points.

34. The apparatus, as set forth in claim 33, wherein the plurality of test pins are dedicated to delivering the internal test points.

35. The apparatus, as set forth in claim 33, wherein the bus comprises a point-to-point bus.

36. The apparatus, as set forth in claim 33, comprising multiple busses, wherein the second test circuit is adapted to deliver the second group of the internal test points onto a respective one of the multiple busses during an idle state of the respective bus.

37. The apparatus, as set forth in claim 33, wherein the first test circuit comprises a first multiplexing circuit and the second test circuit comprises a second multiplexing circuit.

38. The apparatus, as set forth in claim 37, wherein the first multiplexing circuit comprises a single select register to select one set of R first groups of the internal test points, and wherein the second multiplexing circuit comprises a single select register to select one set of R second groups of the internal test points.

39. The apparatus, as set forth in claim 37, wherein the first multiplexing circuit comprises multiple select registers to select multiple sets of R first groups of the internal test points, and wherein the second multiplexing circuit comprises multiple select registers to select multiple sets of R second groups of the internal test points.

40. The apparatus, as set forth in claim 33, wherein the second test circuit comprises a switch to couple the group of internal test points to the bus during the idle state of the bus.

41. The apparatus, as set forth in claim 33, wherein the testing device comprises a logic analyzer.

42. The apparatus, as set forth in claim 33, wherein the testing device comprises an in-circuit emulator.

43. A computer system comprising:

a processor;

a memory controller operatively coupled to the processor;

a memory operatively coupled to the memory controller; and a bridge operatively coupled to the processor, wherein at least one of the processor, the memory controller, and the bridge comprises a bus and a test circuit, the test circuit having a plurality of inputs correlative to internal test points of the at least one of the processor, the memory controller, and the bridge, the test circuit adapted to deliver a group of the internal test points onto the bus to debug the operation of the at least one of the processor, the memory controller, and the bridge during an idle state of the bus and while the at least one of the processor, the memory controller, and the bridge is operational.

* * * * *